(12) United States Patent
Zu et al.

(10) Patent No.: US 8,778,726 B2
(45) Date of Patent: Jul. 15, 2014

(54) ORGANIC LIGHT EMITTING DISPLAY AND METHOD OF FABRICATING THE SAME

(75) Inventors: Young Cheol Zu, Yongin (KR); Jin Woo Park, Yongin (KR); Jae Sun Lee, Yongin (KR); Seung Yong Song, Yongin (KR); Young Seo Choi, Yongin (KR)

(73) Assignee: Samsung Display Co., Ltd., Yongin, Gyeonngi-Do (KR)

( * ) Notice: Subject to any disclaimer, the term of this patent is extended or adjusted under 35 U.S.C. 154(b) by 562 days.

(21) Appl. No.: 12/636,684

(22) Filed: Dec. 11, 2009

(65) Prior Publication Data

US 2010/0099323 A1   Apr. 22, 2010

Related U.S. Application Data

(62) Division of application No. 11/529,989, filed on Sep. 29, 2006, now abandoned.

(30) Foreign Application Priority Data

Feb. 20, 2006 (KR) .................. 10-2006-0016480
Apr. 19, 2006 (KR) .................. 10-2006-0035456

(51) Int. Cl.
  *H01L 51/40* (2006.01)
(52) U.S. Cl.
  USPC .............................. 438/99; 257/40
(58) Field of Classification Search
  USPC .............................. 257/40; 438/99
  See application file for complete search history.

(56) References Cited

U.S. PATENT DOCUMENTS

| 4,192,060 A | 3/1980 | Washizuka et al. |
| 6,369,495 B2 | 4/2002 | Codama et al. |
| 2001/0013756 A1 | 8/2001 | Mori et al. |
| 2002/0060654 A1 | 5/2002 | Park et al. |
| 2003/0107315 A1 | 6/2003 | Chen et al. |
| 2004/0207314 A1 | 10/2004 | Aitken et al. |
| 2005/0046338 A1 | 3/2005 | Park |
| 2005/0117197 A1 | 6/2005 | Ide .................................. 892/61 |

FOREIGN PATENT DOCUMENTS

| JP | 08195138 | 7/1996 |
| JP | 2001-118680 | 4/2001 |

(Continued)

OTHER PUBLICATIONS

Japanese Office Action dated Jul. 27, 2010 in Japanese Patent Application No. 2006-199917.

(Continued)

*Primary Examiner* — Matthew Reames
(74) *Attorney, Agent, or Firm* — Knobbe Martens Olson & Bear LLP

(57) ABSTRACT

An organic light emitting display in which differential pressure is controlled to prevent Newton's rings from being generated and a method of fabricating the same are provided. The organic light emitting display includes a first substrate including a pixel region in which at least one organic light emitting diode (OLED) is formed and a non-pixel region, a second substrate attached to one region including the pixel region of the first substrate, and a frit provided between the non-pixel region of the first substrate and the second substrate. At least one of the first substrate and the second substrate is formed to be convex outward.

7 Claims, 9 Drawing Sheets

(56) References Cited

FOREIGN PATENT DOCUMENTS

| | | | |
|---|---|---|---|
| JP | 2001 217069 | | 8/2001 |
| JP | 2002 280169 | | 9/2002 |
| JP | 2004 110748 | | 4/2004 |
| JP | 2004110748 | * | 4/2004 |
| JP | 2004 280759 | | 10/2004 |
| JP | 2005-071984 | | 3/2005 |
| JP | 2006-031256 A | | 2/2006 |
| KR | 10-2002-0060808 | | 7/2002 |
| KR | 10-2003-0051379 | | 6/2003 |
| KR | 10-2003-0084234 | | 11/2003 |
| KR | 10-2005-0112318 A | | 11/2005 |
| TW | 546857 | | 8/2003 |
| TW | 594616 | | 6/2004 |
| TW | 1224940 | | 12/2004 |
| TW | 200511882 | | 3/2005 |

OTHER PUBLICATIONS

Japan Office Action issued on Jun. 2, 2009 in the corresponding Japanese Patent Application No. 2006-199917.

Korean Office Action issued Apr. 26, 2007 in the counterpart Korean Patent Publication No. 10-2006-0035456.

Chinese patent application No. 2007 10004761-4 Text of the Third Office Action.

Korean Notice of Allowance issued Oct. 31, 2007 in counterpart Korean Patent Publication No. 10-2006-0035456.

European Search Report, for European Patent No. 07250691.8, date of mailing Jul. 1, 2011.

European Examination Report dated Oct. 30, 2013 for European Application No. EP 07 250 691.8 which shares priority of Korean Patent Application Nos. KR Oct. 2006-0016480 *and* KR 10-2006-0035456 with captioned U.S. Appl. No. 12/636,684, and cites the above-identified reference.

* cited by examiner

ORGANIC LIGHT EMITTING DISPLAY AND METHOD OF FABRICATING THE SAME

CROSS-REFERENCE TO RELATED APPLICATIONS

This application is a divisional of U.S. patent application Ser. No. 11/529,989 filed on Sep. 29, 2006, which claims the benefit of Korean Patent Application Nos. 10-2006-0016480 and 10-2006-0035456 filed on Feb. 20, 2006 and Apr. 19, 2006, respectively, in the Korean Intellectual Property Office, the disclosures of which are incorporated herein by reference.

BACKGROUND OF THE INVENTION

1. Field of the Invention

The present invention relates to an organic light emitting display and a method of fabricating the same, and more particularly, to an organic light emitting display in which differential pressure is controlled to prevent Newton's rings from being generated and a method of fabricating the same.

2. Description of the Related Technology

Recently, organic light emitting displays are widely used for its relatively simple structure. The organic light emitting display is a self-emission display in which an organic layer is used as an emission layer. Since the organic light emitting display does not need a back-light for emitting light unlike a liquid crystal display (LCD), the thickness and weight of the organic light emitting display are small. Therefore, the organic light emitting display has been actively developed as a display panel of a portable electronic device such as a portable computer, a mobile telephone, a portable game apparatus, and electronic books.

In an organic light emitting display, one or more organic layers including an emission layer are interposed between first electrodes and second electrodes. The first electrodes are formed on a substrate and function as anodes for injecting holes. The organic layers are formed on the first electrodes. Second electrodes that function as cathodes for injecting electrons are formed on the organic layers to face the first electrodes.

When moisture and oxygen are permeated from the outside to organic light emitting diodes (OLED) in the organic light emitting display, the electrodes are oxidized and separated from each other. In such a case, the life of the OLEDs is reduced, and emission efficiency deteriorates. In addition, emission colors may change.

Therefore, in the fabrication of the organic light emitting display, a sealing process for protecting the OLEDs from the outside may be performed. In one method, a polymer such as polyethyleneteraphthlate (PET) may be laminated on the cathodes of the OLEDs. In another method, a cover or a cap formed of a metal or glass includes an absorbent. In addition, a nitrogen gas may be filled in the cover or the cap. The edges of the cover or the cap may be capsule sealed by a sealant such as an epoxy resin.

However, since it is not possible to completely prevent moisture and oxygen from being permeated from the outside to the OLEDs by the above-described methods, the OLEDs may deteriorate and change.

In order to solve the above problem, a capsule sealing up method in which a frit as a sealing material is used to improve a moisture-proof property between an element substrate and a cap has been proposed. According to U.S. Patent Publication No. 20040207314 in which a structure of coating a glass substrate with a frit to seal up an OLED is disclosed, since a gap between a first substrate and a second substrate is completely sealed up using the frit so that it is possible to effectively protect the OLED.

In the structure where the OLED is sealed up using a sealing substrate coated with the frit, the distance between the substrate and the sealing substrate is smaller than the distance between the substrate and the sealing substrate in a structure where the absorbent is used. Also, in manufacturing the organic light emitting display sealed with the frit, a plurality of display panels are simultaneously fabricated on a mother substrate. Then, the mother substrate may be cut into individual unit display panels. The center of the substrate may be curved down due to the weight of the substrate.

In such an OLED, light incident on the substrate from the outside generates optical interference to form concentric rings at connection points of the sealing substrate. These concentric rings are referred to as Newton's rings. The phenomenon of Newton's rings is an interference pattern caused by the reflection of light between two surfaces: a spherical surface and an adjacent flat surface. It appears as a series of concentric, alternating light and dark rings centered at the point of contact between the two surfaces. The Newton's rings deteriorate the quality of an image during the operation of OLEDs. The discussion in this section is to provide general background of the invention and does not constitute an admission of prior art.

The discussion in this section is to provide background of the related technology, and does not constitute an admission of prior art.

SUMMARY OF CERTAIN INVENTIVE ASPECTS

One aspect of the invention provides an organic light emitting display (OLED) device. The device comprises: a first substrate comprising a first outer surface and a first inner surface; a second substrate generally opposing the first substrate, the second substrate comprising a second outer surface and a second inner surface; an array of organic light emitting pixels interposed between the first and second substrates; and a frit seal interposed between the first and second substrates while surrounding the array, wherein the frit seal, the first substrate, and the second substrate in combination define an enclosed space in which the array is located; wherein the second substrate has a curvature sufficient to substantially reduce Newton's rings on the second substrate compared to when there is no curvature in the second substrate.

A radius of the curvature may range from about 0.2 meters to about 100 meters. The second substrate may bend outward. The second substrate may bend inward. The second substrate may be substantially more flexible than the first substrate. The enclosed space may have a gas pressure substantially the same as the atmospheric pressure. A distance between the first and second inner surfaces may be greater than about 10 μm. The first substrate may have a reflectance of about 60% to about 70%, and wherein the second substrate has a reflectance of about 4%. The second substrate may comprise a material selected from the group consisting of bare glass and edge glass. The device may further comprise another sealing structure interposed between the first and second substrates, wherein the other sealing structure surrounds the frit seal. The other sealing structure and the frit seal may form a gap therebetween.

Another aspect of the invention provides an organic light emitting display (OLED) device, comprising: a first substrate comprising a first outer surface and a first inner surface; a second substrate generally opposing the first substrate, the second substrate comprising a second outer surface and a second inner surface; an array of organic light emitting pixels interposed between the first and second substrates; and a frit seal interposed between the first and second substrates while surrounding the array, wherein the frit seal, the first substrate, and the second substrate in combination define an enclosed space in which the array is located, wherein the second substrate has a curvature, wherein a tangential line at an edge of the second inner surface and the first outer surface have an angle therebetween, the tangential line being perpendicular to the edge of the second inner surface, and wherein the angle is greater than 0° and is sufficient to substantially reduce Newton's rings on the second substrate compared to when the angle is 0°.

The second substrate may bend outward. The second substrate may bend inward. The enclosed space may have a gas pressure substantially the same as the atmospheric pressure. The second substrate may be substantially more flexible than the first substrate.

Another aspect of the invention provides a method of making an organic light emitting display (OLED) device, the method comprising: providing a first substrate and an array of organic light emitting pixels, the array being formed over the first substrate; placing a second substrate over the first substrate so as to interpose the array between the first and second substrates; interposing a frit between the first and second substrates while surrounding the array, wherein the frit, the first substrate, and the second substrate in combination define an enclosed space in which the array is located, wherein the frit substantially hermetically seals the enclosed space, wherein the enclosed space has a predetermined gas pressure; and subjecting the device to the atmospheric pressure so as to form a curvature in the second substrate.

The atmospheric pressure may be 760 Torr. After forming the curvature, the gas pressure within the enclosed space may be substantially equal to the atmospheric pressure outside the enclosed space. The predetermined gas pressure may be sufficiently different from the atmospheric pressure given pliability of the second substrate so as to form such a curvature in the second substrate when subjecting the device to the atmospheric pressure.

The second substrate may generally bend outward after subjecting the device to the atmospheric pressure. The predetermined gas pressure may be higher than the atmospheric pressure. The second substrate may generally bend inward after subjecting the device to the atmospheric pressure. The predetermined air pressure may be lower than the atmospheric pressure. The second substrate may be substantially more flexible than the first substrate. The method may further comprise providing a second seal interposed between the first and second substrates, wherein the second seal surrounds the frit before subjecting the device to the atmospheric pressure. The method may further comprise holding one of outer surfaces of the first and second substrates by suction during interposing the frit.

Another aspect of the invention provides an organic light emitting display in which differential pressure is controlled to prevent Newton's rings from being generated and a method of fabricating the same.

Another aspect of the invention provides an organic light emitting display comprising a first substrate including a pixel region in which at least one organic light emitting diode (OLED) is formed and a non-pixel region, a second substrate attached to one region including the pixel region of the first substrate, and a frit provided between the non-pixel region of the first substrate and the second substrate. At least one of the first substrate and the second substrate is formed to be convex outward.

A sealant for attaching the first substrate and the second substrate to each other is further provided between the first substrate and the second substrate outside the frit. A sealant for attaching the first substrate and the second substrate to each other is further provided between the first substrate and the second substrate inside the frit. The second substrate may be formed of edge glass or bare glass. The distance between the first substrate and the second substrate is no less than about 10 μm when the reflectance of the first substrate is about 60 to about 70% and the reflectance of the second substrate is about 4%.

Yet another aspect of the invention provides a method of fabricating an organic light emitting display including a first substrate including an OLED and a second substrate for sealing up at least the pixel region of the first substrate, the method comprising the steps of providing a first substrate including a pixel region in which an OLED is formed and a non-pixel region, forming a frit on the circumference of the second substrate corresponding to the non-pixel region, attaching the second substrate to the first substrate under predetermined pressure lower than the air pressure, and melting the frit under the air pressure to be adhered to the first substrate. At least one of the first substrate and the second substrate expands outward by a change in pressure.

Another aspect of the invention provides an organic light emitting display comprising a first substrate including a pixel region in which at least one organic light emitting diode (OLED) is formed and a non-pixel region, a second substrate attached to one region including the pixel region of the first substrate, and a frit provided between the non-pixel region of the first substrate and the second substrate. At least one of the first substrate and the second substrate is formed to be concave inward.

Yet another aspect of the invention provides a method of fabricating an organic light emitting display including a first substrate including an OLED and a second substrate for sealing up at least the pixel region of the first substrate, the method comprising the steps of providing a first substrate including a pixel region in which an OLED is formed and a non-pixel region, forming a frit on the circumference of the second substrate corresponding to the non-pixel region, attaching the second substrate to the first substrate under predetermined pressure lower than the air pressure, and melting the frit under the air pressure to be adhered to the first substrate. At least one of the first substrate and the second substrate contracts inward by a change in pressure.

BRIEF DESCRIPTION OF THE DRAWINGS

These and/or other objects and advantages of the invention will become apparent and more readily appreciated from the following description of embodiments, taken in conjunction with the accompanying drawings of which.

DETAILED DESCRIPTION OF CERTAIN INVENTIVE EMBODIMENTS

Hereinafter, embodiments of the invention will be described in detail with reference to the accompanying drawings as follows.

An organic light emitting display (OLED) is a display device comprising an array of organic light emitting diodes. Organic light emitting diodes are solid state devices which include an organic material and are adapted to generate and emit light when appropriate electrical potentials are applied.

Figure 7A:
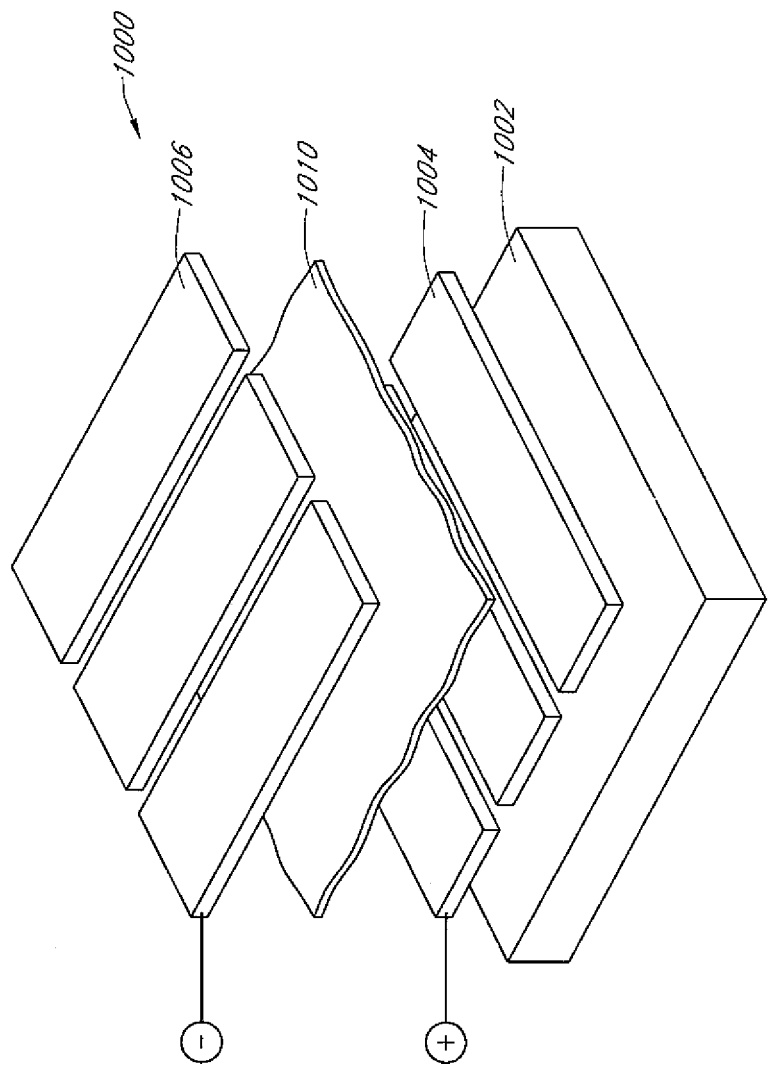
FIG. 7A is a schematic exploded view of a passive matrix type organic light emitting display device in accordance with one embodiment.
Figure 7B:
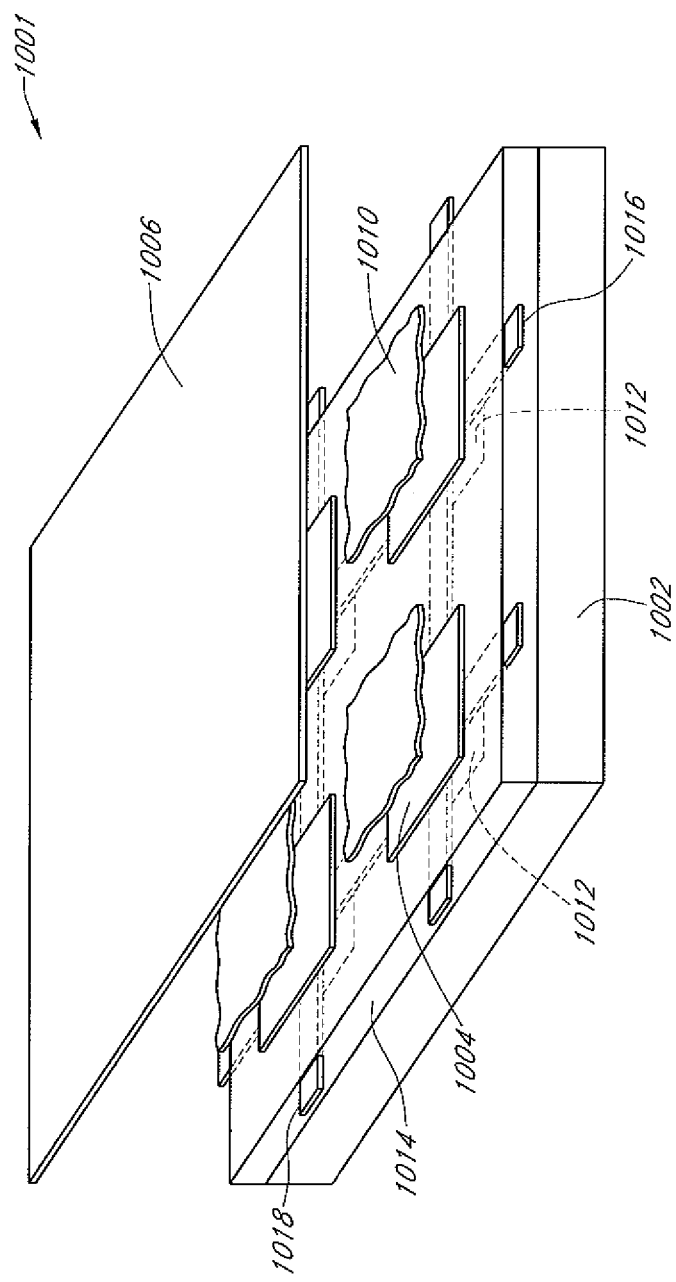
FIG. 7B is a schematic exploded view of an active matrix type organic light emitting display device in accordance with one embodiment.

OLEDs can be generally grouped into two basic types dependent on the arrangement with which the stimulating electrical current is provided. FIG. 7A schematically illustrates an exploded view of a simplified structure of a passive matrix type OLED 1000. FIG. 7B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 7A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 7B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 7D:
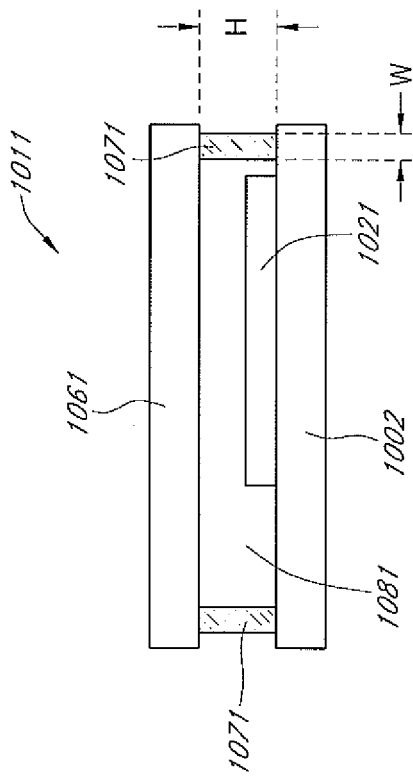
FIG. 7D is a cross-sectional view of the organic light emitting display of FIG. 7C, taken along the line d-d.
Figure 7C:
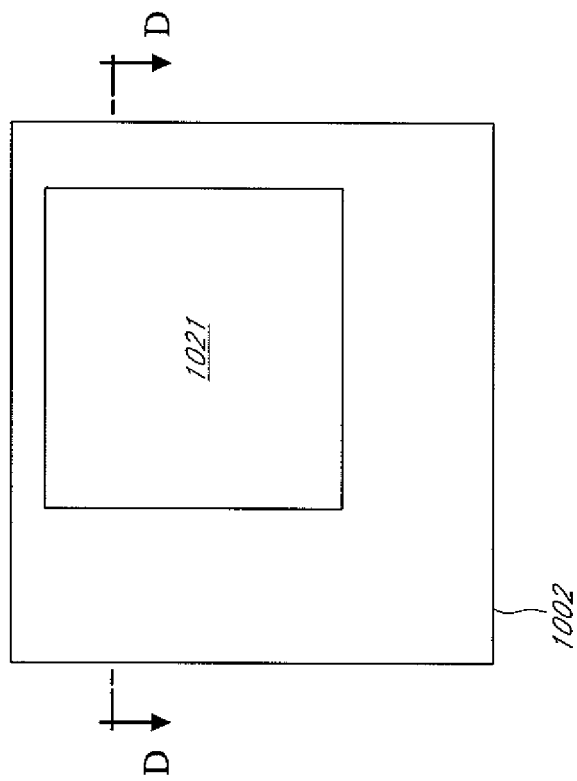
FIG. 7C is a schematic top plan view of an organic light emitting display in accordance with one embodiment.

In many embodiments, an OLED pixel array 1021 comprising a plurality of organic light emitting pixels is arranged over a substrate 1002 as shown in FIG. 7C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 7D schematically illustrates a cross-section of an encapsulated OLED device 1011 having a layout of FIG. 7C and taken along the line d-d of FIG. 7C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 7D. The width varies among embodiments and ranges from about 300 µm to about 3000 µm, optionally from about 500 µm to about 1500 µm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 7D. The height varies among embodiments and ranges from about 2 µm to about 30 µm, optionally from about 10 µm to about 15 µm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 7E:
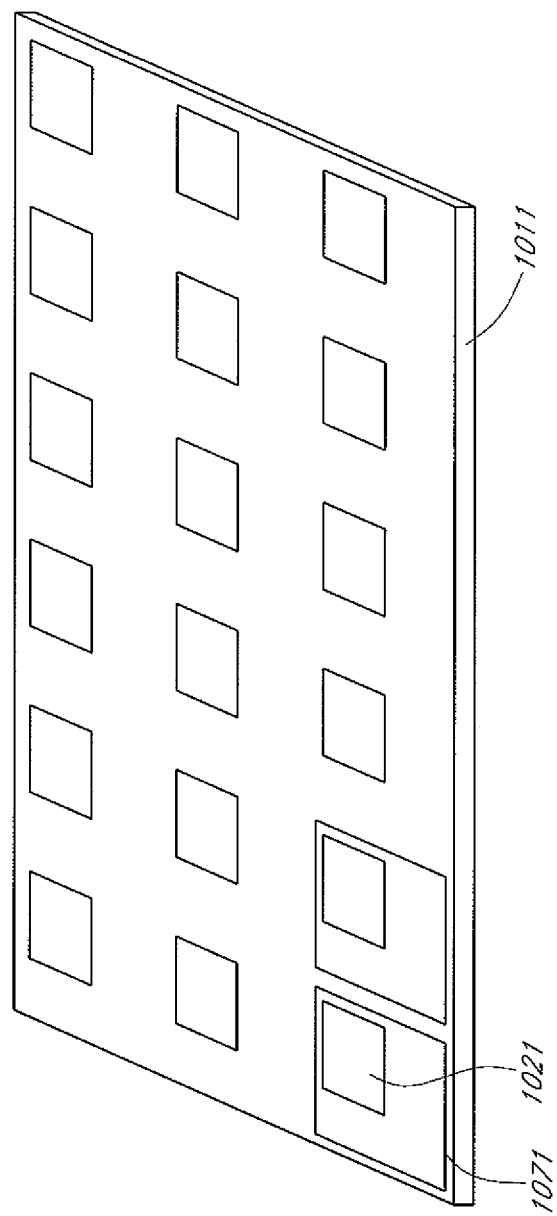
FIG. 7E is a schematic perspective view illustrating mass production of organic light emitting devices in accordance with one embodiment.

In some embodiments, OLED devices 1011 are mass produced. In an embodiment illustrated in FIG. 7E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 7D. In certain embodiments, the individual OLED devices 1011 then further undergo additional packaging operations to further improve the sealing formed by the frit seal 1071 and the top and bottom substrates 1061, 1002.

In one embodiment, an organic light emitting display (OLED) device includes a first substrate comprising a first outer surface and a first inner surface and a second substrate generally opposing the first substrate. The second substrate has a second outer surface and a second inner surface. The OLED device also includes an array of organic light emitting pixels interposed between the first and second substrates. The OLED further includes a frit seal interposed between the first and second substrates while surrounding the array. The frit seal, the first substrate, and the second substrate in combination define an enclosed space in which the array is located.

The second substrate may have a curvature with a radius of the curvature. The curvature may be formed across the entire second substrate. In other embodiments, the curvature may be formed in a portion of the second substrate. The second substrate may have a curvature sufficient to substantially reduce Newton's rings on the second substrate compared to when there is no curvature in the second substrate.

In one embodiment, a radius of the curvature may range from about 0.2 m to about 200 m. The radius of the curvature may be selected from 0.2 m, 0.3 m, 0.4 m, 0.5 m, 0.75 m, 1 m, 1.25 m, 1.5 m, 1.75 m, 2 m, 2.25 m, 2.5 m, 2.75 m, 3 m, 3.25 m, 3.5 m, 3.75 m, 4 m, 4.25 m, 4.5 m, 4.75 m, 5 m, 5.25 m, 5.5 m, 5.75 m, 6 m, 6.25 m, 6.5 m, 6.75 m, 7 m, 7.25 m, 7.5 m, 7.75 m, 8 m, 8.25 m, 8.5 m, 8.75 m, 9 m, 9.25 m, 9.5 m, 9.75 m, 10 m, 15 m, 20 m, 25 m, 30 m, 35 m, 40 m, 45 m, 50 m, 55 m, 60 m, 65 m, 70 m, 75 m, 80 m, 85 m, 90 m, 95 m, 100 m, 110 m, 120 m, 130 m, 140 m, 150 m, 160 m, 170 m, 180 m, 190 m, and 200 m. A skilled artisan will appreciate that the radius of the curvature may vary depending on the size and configuration of the OLED device.

In another embodiment, a tangential line at an edge of the second inner surface and the first outer surface have an angle therebetween. The tangential line is perpendicular to the edge of the second inner surface. The angle is greater than 0° and is sufficient to substantially reduce Newton's rings on the second substrate compared to when the angle is 0°. In one embodiment, the angle may be between about 0.05 degrees and about 15 degrees. The angle may be selected from 0.05, 0.06, 0.07, 0.08, 0.09, 0.10, 0.11, 0.12, 0.13, 0.14, 0.15, 0.16, 0.17, 0.18, 0.19, 0.20, 0.21, 0.22, 0.23, 0.24, 0.25, 0.26, 0.27, 0.28, 0.29, 0.30, 0.31, 0.32, 0.33, 0.34, 0.35, 0.36, 0.37, 0.38, 0.39, 0.40, 0.41, 0.42, 0.43, 0.44, 0.45, 0.46, 0.47, 0.48, 0.49, 0.50, 0.51, 0.52, 0.53, 0.54, 0.55, 0.56, 0.57, 0.58, 0.59, 0.60, 0.61, 0.62, 0.63, 0.64, 0.65, 0.66, 0.67, 0.68, 0.69, 0.70, 0.71, 0.72, 0.73, 0.74, 0.75, 0.76, 0.77, 0.78, 0.79, 0.80, 0.81, 0.82, 0.83, 0.84, 0.85, 0.86, 0.87, 0.88, 0.89, 0.90, 0.91, 0.92, 0.93, 0.94, 0.95, 0.96, 0.97, 0.98, 0.99, 1, 2, 3, 4, 5, 6, 7, 8, 9, 10, 11, 12, 13, 14, and 15 degrees. A skilled artisan will appreciate that the angle may vary depending on the size and configuration of the OLED device.

Figure 1:
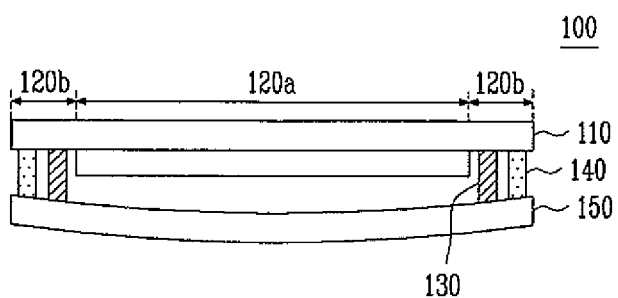
FIG. 1 is a schematic cross-sectional view illustrating an organic light emitting display according to a first embodiment.

FIG. 1 is a cross-sectional view illustrating an organic light emitting display according to a first embodiment. Referring to FIG. 1, an organic light emitting display 100 includes a first substrate 110, a second substrate 150, and a frit 130. The first substrate 110 includes a pixel region 120a in which at least one organic light emitting diode (OLED) is formed and a non-pixel region 120b. The second substrate 150 is placed over the pixel region 120a and at least a portion of the non-pixel region 120b of the first substrate 110. The frit 130 is provided between the non-pixel region 120b of the first substrate 110 and the second substrate 150. At least one of the first substrate 110 and the second substrate 150 may become convex outward.

The substrate 110 includes the pixel region 120a and the non-pixel region 120b. The pixel region 120a may include at least one OLED having a first electrode, an organic layer, and a second electrode. The non-pixel region 120b surrounds the pixel region 120a. The pixel region 120a refers to a region which displays an image. The non-pixel region 120b refers to the substantially all the region outside the pixel region 120a.

The frit 130 is provided between the non-pixel region 120b of the first substrate 110 and the second substrate 150 to adhere the first substrate 110 and the second substrate 150 to each other. The term "frit" may refer to powder type glass. In the context of this document, a frit may also refer to gel or paste type glass that may be obtained by adding an organic material to the powder type glass or a solid glass that may be obtained by radiating laser onto the powder type glass so that the powder type glass is hardened.

A sealant 140 may be formed on the outermost peripheries of the second substrate 150 outside the frit 130. The sealant 140 is formed outside the frit 130 to improve adhesive strength between the first substrate 110 and the second substrate 150. The illustrated sealant 140 is formed outside the frit 130. In other embodiments, the sealant 140 may be formed inside the frit 130.

The external center of the second substrate 150 is convex, as shown in FIG. 1. Since the external center of the second substrate 150 is convex, the distance between the center of the first substrate 110 and the center of the second substrate 150 is larger than the height of the frit 130 or the sealant 140. For example, when the reflectance of the first substrate 110 is about 60 to about 70% (LTPS glass) and the reflectance of the second substrate 150 is about 4% (bare glass), the distance between the first substrate 110 and the second substrate 150 may be maintained to be no less than 10 μm. This configuration may prevent Newton's rings from being generated. The second substrate 150 may be formed of edge glass or bare glass. When the second substrate 150 is formed of the edge glass, the distance between the first substrate 110 and the second substrate 150 is no less than several tens μm along the edge region. Thus, optical interference intensity may be reduced. As used herein, the term "edge glass" refers to a glass plate having an etched or recessed portion on at least one of the surfaces thereof. The etched or recessed portion may be formed by a chemical or mechanical process. The term "bare glass," as used herein, generally refers to a flat glass plate.

FIGS. 2A to 2E are cross-sections illustrating a method of fabricating the organic light emitting display according to the first embodiment. FIG. 3 is a cross-sectional view illustrating the angle of the curvature of the second substrate according to the first embodiment.

Figure 2A:
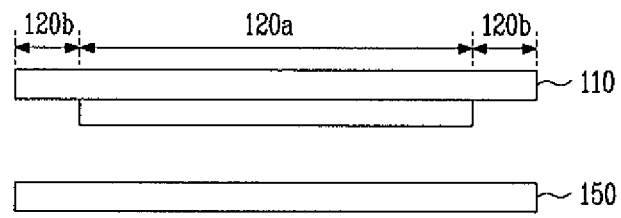
FIGS. 2A to 2E are schematic cross-sectional views illustrating a method of fabricating the organic light emitting display of FIG. 1.
Figure 3:
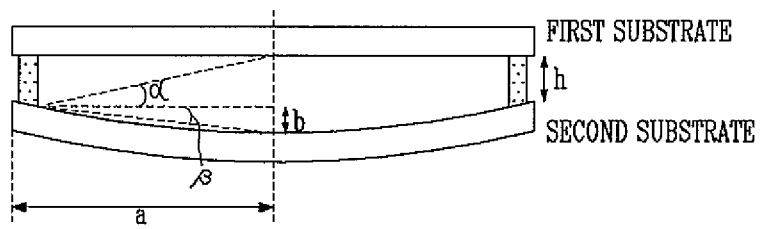
FIG. 3 is a schematic cross-sectional view illustrating the angle of the curvature of the second substrate according to the first embodiment.

Referring to FIG. 2A, the substrate 110 includes the pixel region 120a in which at least one OLED including a first electrode, an organic layer, and a second electrode is formed, and the non-pixel region 120b surrounding the pixel region 120a. The second substrate 150 for sealing the first substrate 110 is positioned under the first substrate 110.

Figure 2B:
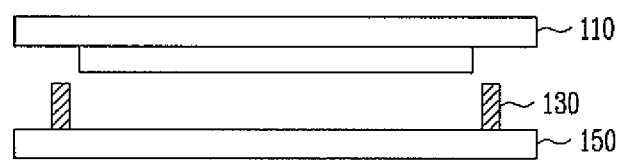

Referring to FIG. 2B, a fit 130 is applied to one region of the second substrate 150 that corresponds to the non-pixel region 120b. The frit 130 may include, as additives, a filler (not shown) for controlling a thermal expansion coefficient and an absorbent (not shown) that absorbs laser or infrared rays. In one embodiment, the frit may include a powder type glass and an oxide powder. The temperature of a glass material is rapidly dropped so that the powder type glass is obtained. An organic material may be added to the frit so that gel type paste is obtained. Then, when the frit 130 is annealed at a predetermined temperature, the organic material is removed and the gel type frit paste is hardened so that the solid frit 130 is obtained. The temperature at which the frit 130 is annealed may be in the range of about 300° C. to about 700° C.

Figure 2C:
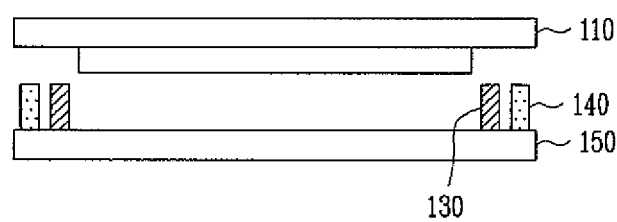

Referring to FIG. 2C, the sealant 140 may be formed on the outermost peripheries of the second substrate 150, outside the frit 130. The sealant 140 is formed outside the frit 130 to improve the adhesive strength between the first substrate 110 and the second substrate 150. The sealant 140 may be formed by a bar coating method using sputtering or a roller.

Figure 2D:
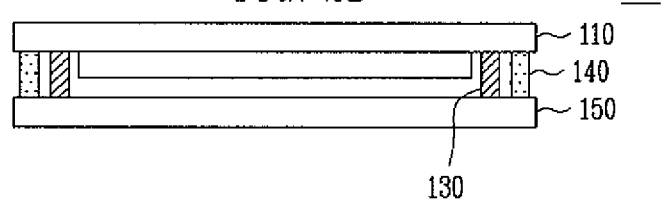

Referring to FIG. 2D, the first substrate 110 and the second substrate 150 are placed into a vacuum chamber (not shown). After placing the first substrate 110 and the second substrate 150 into the vacuum chamber, the pressure in the vacuum chamber may be reduced to negative pressure that is lower than the atmospheric pressure (760 torr) using pressure controlling means. In this embodiment, the pressure in the vacuum chamber is maintained to be higher than the pressure P1 between the first substrate and the second substrate that are not attached to each other in order to maintain the pressure between the first substrate 110 and the second substrate 120 that are attached to each other at the atmospheric pressure 760 torr. When it is assumed that $P_1*V_1=P_2*V_2$, a value obtained by multiplying the pressure and the volume between the first substrate and the second substrate that are not attached to each other is equal to a value obtained by multiplying the pressure and the volume between the first substrate and the second substrate that are attached to each other. The pressure P1 can be represented by EQUATION 1.

$$P_1=760*V_2/V_1 \quad \text{EQUATION 1}$$

In EQUATION 1, P1, V1, P2, and V2 denote the pressure between the first substrate and the second substrate that are not attached to each other, the volume between the first substrate and the second substrate that are not attached to each other, the pressure between the first substrate and the second substrate that are attached to each other, and the volume between the first substrate and the second substrate that are attached to each other, respectively.

The EQUATION 1 represents the Boyle's law in which the pressure of a gas is in inverse proportion to the volume of the gas at a constant temperature. That is, when the pressure is applied from the outside to reduce the volume of the gas to ½, the density of the gas doubles and the number of collision of the gas per unit time doubles so that the pressure doubles. To the contrary, when the pressure from the outside is reduced, the gas expands so that the volume of the gas increases. Therefore, the volume of a uniform gas is in inverse proportion to the pressure at a uniform temperature.

Then, the first substrate 110 and the second substrate 150 are attached to each other by a physical force. Therefore, the pressure of the gas molecules between the first substrate 110 and the second substrate 150 is maintained to be higher than the pressure P1.

Figure 2E:
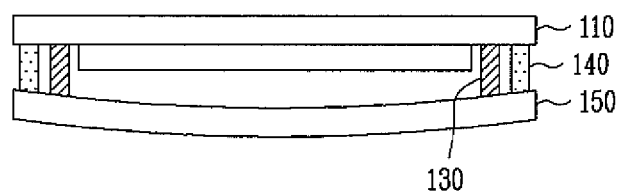

Referring to FIG. 2E, the vacuum of the vacuum chamber is broken or the first substrate 110 and the second substrate 120 that are attached to each other are exposed to the atmospheric pressure. When the first substrate 110 and the second substrate 150 that are attached to each other are exposed to the atmospheric pressure, due to a difference in pressure (differential pressure) between the pressure between the first substrate 110 and the second substrate 150 that are attached to each other and the atmospheric pressure, the volume of the gas molecules that exist between the first substrate 110 and the second substrate 150 increases by the amount of the differential pressure. Therefore, the first substrate 110 and the second substrate 150 expand outward.

The angles of the first substrate and the second substrate are represented by EQUATION 2 (refer to FIG. 3).

$$h>10 \text{ μm}$$

$$\tan\alpha=h/a$$

$$h=a*\tan\alpha>10 \text{ μm} \quad \text{EQUATION 2}$$

Therefore, $\alpha>\tan^{-1}(10/a)$ wherein $\alpha<45°$ and the value of β is not limited.

In the EQUATION 2, α, β, h, a, and b represent the angle corresponding to the distance between the first substrate and the second substrate, the angle that is formed by the curvature of the second substrate that expands and the peak between the two ends of the second substrate, the height of the frit provided between the first substrate and the second substrate, ½ of the length of the second substrate, and the height of the peak of the curvature of the second substrate, respectively.

At least one of the first substrate 110 and the second substrate 150 may be provided with a vacuum pump or suction in order to prevent sliding of the substrates due to the difference in pressure. For example, a plurality of inlets (not shown) for inhaling the air are provided on one surface of the first substrate 110. The inlets are connected to an air inhaling device such as a vacuum pump (not shown) that is positioned on one side of the first substrate 110 through outlets. Therefore, the air that is inhaled to the inside of the first substrate 110 through the inlets is discharged to the air inhaling device such as the vacuum pump through the outlets. One of the first substrate 110 and the second substrate 150 is fixed using a vacuum suction plate under the first substrate 110 so as to prevent the sliding of the first substrate 110 and the second substrate 150 and to change the shape of a desired substrate.

In one embodiment, the first substrate 110 is fixed to the plate by the above method so that only the second substrate 150 expands to become convex. Since the center of the second substrate 150 expands to become convex, the distance between the centers of the first substrate 110 and the second substrate 150 that are attached to each other is maintained to be larger than the height of the frit 130 or the sealant 140.

Then, laser or infrared rays may be radiated onto the frit 130 to melt the frit 130. Therefore, the first substrate 110 and the second substrate 150 are interconnected to each other.

Figure 4:
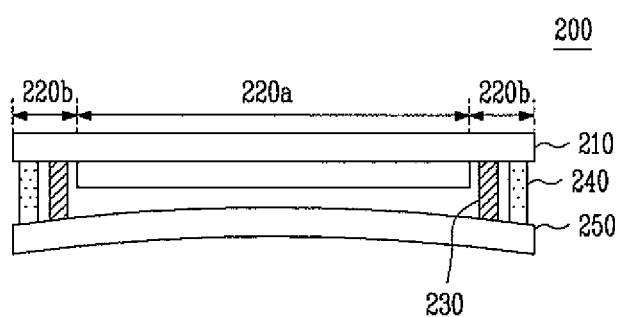
FIG. 4 is a schematic cross-sectional view illustrating an organic light emitting display according to a second embodiment.

FIG. 4 is a sectional view illustrating an organic light emitting display according to a second embodiment. Referring to FIG. 4, the organic light emitting display includes a first substrate 210 including a pixel region 220a in which at least one organic light emitting diode (OLED) is formed and a non-pixel region 220b that is formed outside the pixel region 220a, a second substrate 250 that is attached to one region including the pixel region 220a of the first substrate 210, and a frit 230 that is provided between the non-pixel region 220b of the first substrate 210 and the second substrate 250. At least one of the first substrate 210 and the second substrate 250 is formed to be concave inward.

In order to avoid redundancy, description of the first substrate 210, the frit 230, and the sealant 240 that are the same elements as those of the above-described first embodiment will be omitted.

The second substrate 250 is formed to be concave inward, which is caused by reduction in pressure, that is, difference in pressure between the pressure between the first substrate 210 and the second substrate 250 that are not attached and the pressure between the first substrate 210 and the second substrate 250 that are attached to each other. For example, when the reflectance of the first substrate 210 is about 60 to about 70% (LTPS glass) and the reflectance of the second substrate 250 is about 4% (bare glass), it is possible to prevent the distance between the first substrate 210 and the second substrate 250 from being reduced to be less than 10 μm and to thus prevent Newton's rings from being generated.

FIGS. 5A to 5E are schematic cross-sections illustrating a method of fabricating the organic light emitting display according to the second embodiment. FIG. 6 is a sectional view illustrating the angle of the curvature of the second substrate according to the second embodiment.

Figure 5A:
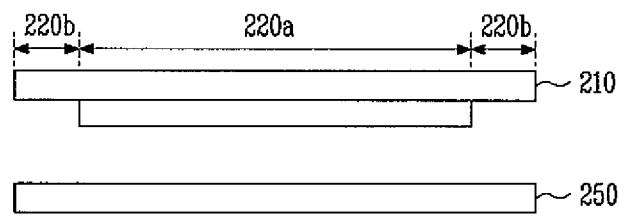
FIGS. 5A to 5E are schematic cross-sectional views illustrating a method of fabricating the organic light emitting display of FIG. 4.
Figure 6:
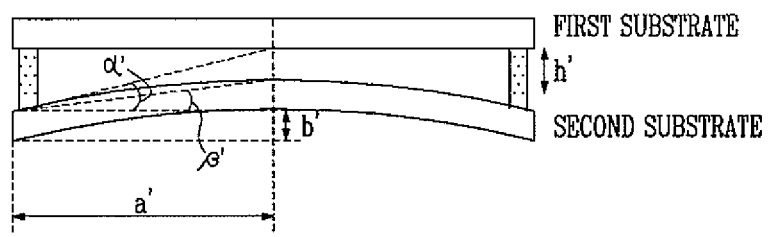
FIG. 6 is a schematic cross-sectional view illustrating the angle of the curvature of the second substrate according to the second embodiment.

Referring to FIG. 5A, the substrate 210 includes the pixel region 220a in which at least one OLED including a first electrode, an organic layer, and a second electrode is formed and the non-pixel region 220b that is formed outside the pixel region 220a. The second substrate 250 for sealing up the first substrate 210 is positioned under the first substrate 210.

Figure 5B:
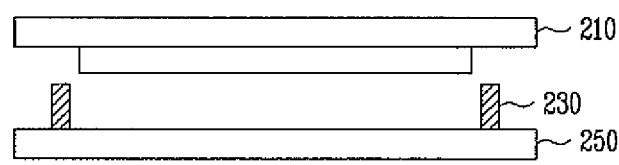
Figure 5C:
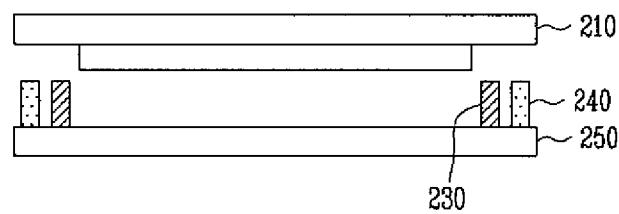

Referring to FIG. 5B, one region of the second substrate 250 that corresponds to the non-pixel region 220b is coated with the frit 230 so that the pixel region 220a of the first substrate 210 is sealed up. Referring to FIG. 5C, the sealant 240 is formed on the outermost periphery of the second substrate 250, that is, outside of the frit 230.

Figure 5D:

Referring to FIG. 5D, the first substrate 210 and the second substrate 250 are placed in a vacuum chamber (not shown). After placing the first substrate 210 and the second substrate 250 into the vacuum chamber, the pressure in the vacuum chamber is reduced to negative pressure that is lower than the atmospheric pressure (760 torr) using pressure controlling means. At this time, the pressure in the vacuum chamber is maintained to be lower than the pressure P1 between the first substrate and the second substrate that are not attached to each other in order to maintain the pressure between the first substrate 210 and the second substrate 220 that are attached to each other as the air pressure 760 torr. When it is assumed that $P_1*V_1=P_2*V_2$, since the value that is obtained by multiplying the pressure and the volume between the first substrate and the second substrate that are not attached to each other by each other must be equal to the value that is obtained by multiplying the pressure and the volume between the first substrate and the second substrate that are attached to each other, the pressure P1 can be represented by EQUATION 3.

$$P_1=760*V_2/V_1 \quad \text{EQUATION 3}$$

In Equation 3, P1, V1, P2, and V2 denote the pressure between the first substrate and the second substrate that are not attached to each other, the volume between the first substrate and the second substrate that are not attached to each other, the pressure between the first substrate and the second substrate that are attached to each other, and the volume between the first substrate and the second substrate that are attached to each other, respectively.

The EQUATION 3 represents the Boyle's law in which the pressure of a gas is in inverse proportion to the volume of the gas at a uniform temperature. That is, when the pressure is applied from the outside to reduce the volume of the gas to ½, the density of the gas doubles and the number of time of collision of the gas per a unit time doubles so that the pressure doubles. To the contrary, when the pressure from the outside is reduced, the gas expands so that the volume of the gas increases. Therefore, the volume of a uniform gas is in inverse proportion to the pressure at a uniform temperature.

Then, the first substrate 210 and the second substrate 250 are attached to each other by physical force. Therefore, the pressure of the gas molecules between the first substrate 210 and the second substrate 250 is maintained to be lower than the pressure P1.

Figure 5E:
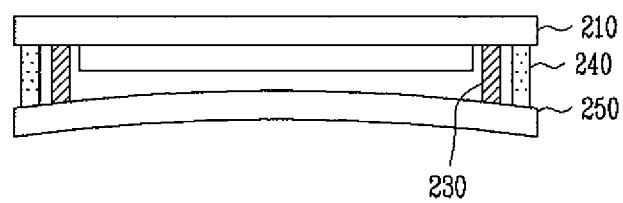

Referring to FIG. 5E, the vacuum of the vacuum chamber is broken or the first substrate 210 and the second substrate 220 that are attached to each other are exposed to the atmospheric pressure. When the first substrate 210 and the second substrate 250 that are attached to each other under the negative pressure that is lower than the pressure P1 are exposed to the atmospheric pressure, due to difference in pressure (differential pressure) between the pressure between the first substrate 210 and the second substrate 250 that are attached to each other and the air pressure, the volume of the gas molecules that exist between the first substrate 210 and the second substrate 250 is reduced. Therefore, the first substrate 210 and the second substrate 250 contract inward.

The angles of the first substrate and the second substrate are represented by EQUATION 4 (refer to FIG. 6).

$$h'-b'>10 \ \mu m$$

$$\tan \alpha'=h'/a', \tan \beta'=b'/a' \quad \text{EQUATION 4}$$

Therefore, $h'=a'*\tan \alpha'$ and $b'=a'*\tan \beta'$ $$a'*(\tan \alpha' - \tan \beta')>10 \ \mu m$$

$$\tan \beta'<(\tan \alpha'-10 \ \mu m/a'), \text{ where } a'>0 \text{ and } \alpha,' \beta'<45°$$

$$\beta'<\tan^{-1}((h'-10 \ \mu m)/a')$$

In the EQUATION 4, $\alpha'$, $\beta'$, h', a, and b' represent the angle corresponding to the distance between the first substrate and the second substrate, the angle that is formed by the curvature of the second substrate that expands and the peak between the two ends of the second substrate, the height of the frit provided between the first substrate and the second substrate, ½ of the length of the second substrate, and the height of the peak of the curvature of the second substrate, respectively.

In one embodiment, at least one of the first substrate 210 and the second substrate 250 includes a vacuum pump or suction in order to prevent sliding of the substrates due to the difference in pressure. For example, a plurality of inlets (not shown) for inhaling the air are provided to one surface of the first substrate 210. The inlets are connected to an air inhaling device such as a vacuum pump (not shown) that is positioned on one side of the first substrate 210 through outlets. Therefore, the air that is inhaled to the inside of the first substrate 210 through the inlets is discharged to the air inhaling device such as the vacuum pump through the outlets. One of the first substrate 210 and the second substrate 250 is fixed using a vacuum suction plate under the first substrate 210 so as to prevent the sliding of the first substrate 210 and the second substrate 250 and to change the shape of a desired substrate.

In one embodiment, the first substrate 210 is fixed to the plate by the above method so that the center of the second substrate 250 contracts to become concave. A predetermined pressure is maintained between the first substrate 210 and the second substrate 250 so that it is possible to prevent the second substrate 250 from being sagged.

Then, laser or infrared rays are radiated onto the frit 230 to melt the frit 230. Therefore, the first substrate 210 and the second substrate 250 are adhered to each other.

As described above, according to the embodiments, the pressure between the first substrate and the second substrate of the organic light emitting display is controlled so that the distance between the first substrate and the second substrate is maintained to be uniform. Therefore, it is possible to prevent the Newton's rings, that is, the concentric rings that are displayed on a screen from being generated.

Although a few embodiments of the invention have been shown and described, it would be appreciated by those skilled in the art that changes might be made in this embodiment without departing from the principles and spirit of the invention, the scope of which is defined in the claims and their equivalents.

What is claimed is:

1. A method of making an organic light emitting display (OLED) device, the method comprising:
   providing a first substrate and an array of organic light emitting pixels, the array being formed over the first substrate;
   providing a second substrate and a frit, the frit formed on the second substrate to surround the array;
   attaching the first substrate and the second substrate to each other under a predetermined gas pressure, wherein the predetermined gas pressure is higher than 760 Torr;
   subjecting the device to a pressure less than the predetermined gas pressure so as to form a curvature in the second substrate due to a difference in pressure; and heating the frit, wherein the frit, the first substrate, and the second substrate in combination define an enclosed space in which the array is located, wherein the frit substantially hermetically seals the enclosed space.

2. The method of claim 1, wherein after forming the curvature, the gas pressure within the enclosed space is substantially equal to the atmospheric pressure outside the enclosed space.

3. The method of claim 1, wherein the predetermined gas pressure is sufficiently different from the atmospheric pressure given pliability of the second substrate so as to form such a curvature in the second substrate when subjecting the device to the atmospheric pressure.

4. The method of claim 1, wherein the second substrate generally bends outward after subjecting the device to the atmospheric pressure.

5. The method of claim 1, wherein the second substrate is substantially more flexible than the first substrate.

6. The method of claim 1, further comprising providing a second seal interposed between the first and second substrates, wherein the second seal surrounds the frit before subjecting the device to the atmospheric pressure.

7. The method of claim 1, further comprising holding one of outer surfaces of the first and second substrates by suction during interposing the frit.

* * * * *

UNITED STATES PATENT AND TRADEMARK OFFICE
CERTIFICATE OF CORRECTION

PATENT NO. : 8,778,726 B2  Page 1 of 1
APPLICATION NO. : 12/636684
DATED : July 15, 2014
INVENTOR(S) : Young Cheol Zu It is certified that error appears in the above-identified patent and that said Letters Patent is hereby corrected as shown below:

On the Title Page
    Page 1 (item 73, Assignee) at line 2, Change "Gyeonngi-Do" to --Gyeonggi-Do--.
    In column 2 (page 2, item 56) at line 14, Under Other Publications, Change "KR Oct. 2006-0016480" to --KR 10-2006-0016480--.

In the Specification
    In column 12 at line 40, Change "fit" to --frit--.

Signed and Sealed this
Third Day of March, 2015

Michelle K. Lee
*Deputy Director of the United States Patent and Trademark Office*